United States Patent
Zeng et al.

(10) Patent No.: US 9,893,049 B2
(45) Date of Patent: Feb. 13, 2018

(54) ELECTROSTATIC DISCHARGE PROTECTION DEVICE

(71) Applicant: MediaTek Inc., Hsin-Chu (TW)

(72) Inventors: Zheng Zeng, Fremont, CA (US); Ching-Chung Ko, Jhubei (TW); Bo-Shih Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/630,733

(22) Filed: Feb. 25, 2015

(65) Prior Publication Data
US 2015/0171072 A1 Jun. 18, 2015

Related U.S. Application Data

(63) Continuation of application No. 14/108,559, filed on Dec. 17, 2013, now abandoned.

(60) Provisional application No. 61/755,248, filed on Jan. 22, 2013.

(51) Int. Cl.
| | |
|---|---|
| *H01L 23/62* | (2006.01) |
| *H01L 27/02* | (2006.01) |
| *H01L 29/47* | (2006.01) |
| *H01L 29/872* | (2006.01) |
| *H01L 29/78* | (2006.01) |

(52) U.S. Cl.
CPC .......... *H01L 27/0255* (2013.01); *H01L 29/47* (2013.01); *H01L 29/78* (2013.01); *H01L 29/872* (2013.01)

(58) Field of Classification Search
CPC . H01L 27/0255; H01L 21/8238; H01L 29/78; H01L 29/47; H01L 29/872
See application file for complete search history.

(56) References Cited

U.S. PATENT DOCUMENTS

| | | | |
|---|---|---|---|
| 603,438 | A | 5/1898 | Zwissler |
| 5,760,391 | A | 6/1998 | Narendran |
| 5,763,918 | A | 6/1998 | El-Kareh et al. |
| 6,034,388 | A | 3/2000 | Brown et al. |
| 7,420,252 | B2 | 9/2008 | Wu et al. |
| 7,939,905 | B2 | 5/2011 | Nagai |
| 8,227,856 | B2 | 7/2012 | Kitajima |
| 8,598,656 | B2 | 12/2013 | Zhu et al. |
| 2006/0145262 | A1 | 7/2006 | Lu et al. |

(Continued)

FOREIGN PATENT DOCUMENTS

| | | |
|---|---|---|
| CN | 101097915 A | 1/2008 |
| CN | 102194874 A | 1/2008 |

(Continued)

*Primary Examiner* — Trung Q Dang
*Assistant Examiner* — Wasiul Haider
(74) *Attorney, Agent, or Firm* — McClure, Qualey & Rodack, LLP

(57) ABSTRACT

The invention provides an electrostatic discharge (ESD) protection device. The ESD protection device includes a semiconductor substrate having an active region, a first well region having a first conductive type formed in the active region, a first doped region having the first conductive type formed in the first well region, a first metal contact disposed on the first doped region, and a second metal contact disposed on the active region, connecting to the first well region, wherein no doped region is formed between the second metal contact and the first well region.

19 Claims, 15 Drawing Sheets

(56) References Cited

U.S. PATENT DOCUMENTS

| | | | |
|---|---|---|---|
| 2006/0181824 | A1 | 8/2006 | Shim et al. |
| 2010/0038718 | A1 | 2/2010 | Zhu et al. |
| 2010/0320501 | A1 | 12/2010 | Gendron et al. |
| 2011/0157754 | A1 | 6/2011 | Nagai |
| 2011/0215404 | A1 | 9/2011 | Zhu et al. |
| 2011/0263112 | A1* | 10/2011 | Trivedi ............. H01L 21/28537 438/570 |
| 2012/0242400 | A1* | 9/2012 | Shaeffer .......... H01L 21/823892 327/536 |
| 2013/0228868 | A1* | 9/2013 | Stribley ................ H01L 27/027 257/360 |
| 2013/0285209 | A1* | 10/2013 | Lee ..................... H01L 27/0255 257/547 |
| 2015/0311192 | A1* | 10/2015 | Lin ................... H01L 21/02518 438/237 |

FOREIGN PATENT DOCUMENTS

| | | |
|---|---|---|
| CN | 101651152 A | 2/2010 |
| CN | 101651152 A | 9/2011 |
| CN | 102194874 A | 9/2011 |
| TW | 200503233 | 1/2005 |
| TW | I326125 | 6/2010 |

* cited by examiner

US 9,893,049 B2

ELECTROSTATIC DISCHARGE PROTECTION DEVICE

CROSS REFERENCE TO RELATED APPLICATIONS

This application is a continuation of pending U.S. application Ser. No. 14/108,559, filed on Dec. 17, 2013, which claims the benefit of U.S. Provisional Application No. 61/755,248, filed on Jan. 22, 2013, the entireties of which are incorporated by reference herein.

BACKGROUND OF THE INVENTION

Field of the Invention

The present invention relates to an electrostatic discharge (ESD) protection device, and in particular, to an ESD protection device formed by a Schottky diode for an input/output (I/O) device.

Description of the Related Art

Requirements for electrostatic discharge (ESD) protection devices for an input/output (I/O) device are excellent ESD protection and low capacitive loading. The conventional ESD protection devices for an input/output (I/O) device include shallow trench isolation (STI) diodes or gated diodes. However, the design rule of STI limits the dimension shrinkage of the STI diodes. Also, the conventional ESD protection devices are not suited for high-speed circuits (such as RF interfaces) because the conventional STI diodes and gated diodes shunt a large part of the RF signal to supply (VDD/VSS) lines through high parasitic junction capacitance.

Thus, a novel ESD protection device structure for an input/output (I/O) device is desirable.

BRIEF SUMMARY OF INVENTION

An electrostatic discharge (ESD) protection device is provided. An exemplary embodiment of an ESD protection device comprises a semiconductor substrate having an active region. A first well region having a first conductive type is formed in the active region. A first doped region having the first conductive type is formed in the first well region. A first metal contact is disposed on the first doped region. A second metal contact is disposed on the active region, connecting to the first well region, wherein the first metal contact and a second metal contact are separated by a poly pattern or an insulating layer pattern disposed on the first well region.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
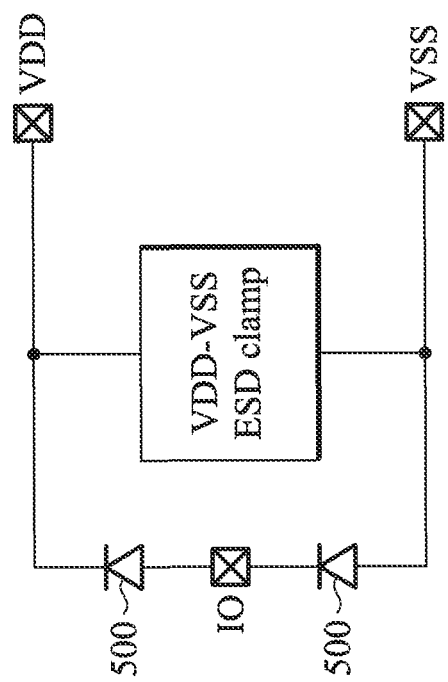
FIG. 1 is a circuit diagram of one exemplary embodiment of an electrostatic discharge (ESD) protection device of the invention.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIG. 1 is a circuit diagram of one exemplary embodiment of an electrostatic discharge (ESD) protection device 500 of the invention. The circuit diagram as shown in FIG. 1 illustrate two electrostatic discharge (ESD) protection devices 500 used to protect an input/output (IO) device. As shown in FIG. 1, the ESD protection devices 500 are diode-typed ESD protection devices. For IO device protection, an anode of the ESD protection device 500 may be coupled to a high voltage power supply terminal VDD, and a cathode of the ESD protection device 500 may be coupled to a protected IO device. Alternatively, an anode of the ESD protection device 500 may be coupled to the protected IO device, and a cathode of the ESD protection device 500 may be coupled to a low voltage power supply terminal VSS. The IO device may comprise metal-oxide-semiconductor field-effect transistors (MOS transistors), erasable programmable read-only memories (EPROMs), electrically erasable programmable read-only memories (EEPROMs), static random access memories (SRAMs), dynamic random access memories (DRAMs), single electron transistors (SETs), diodes, capacitors, inductors or combinations thereof.

Figure 2A:
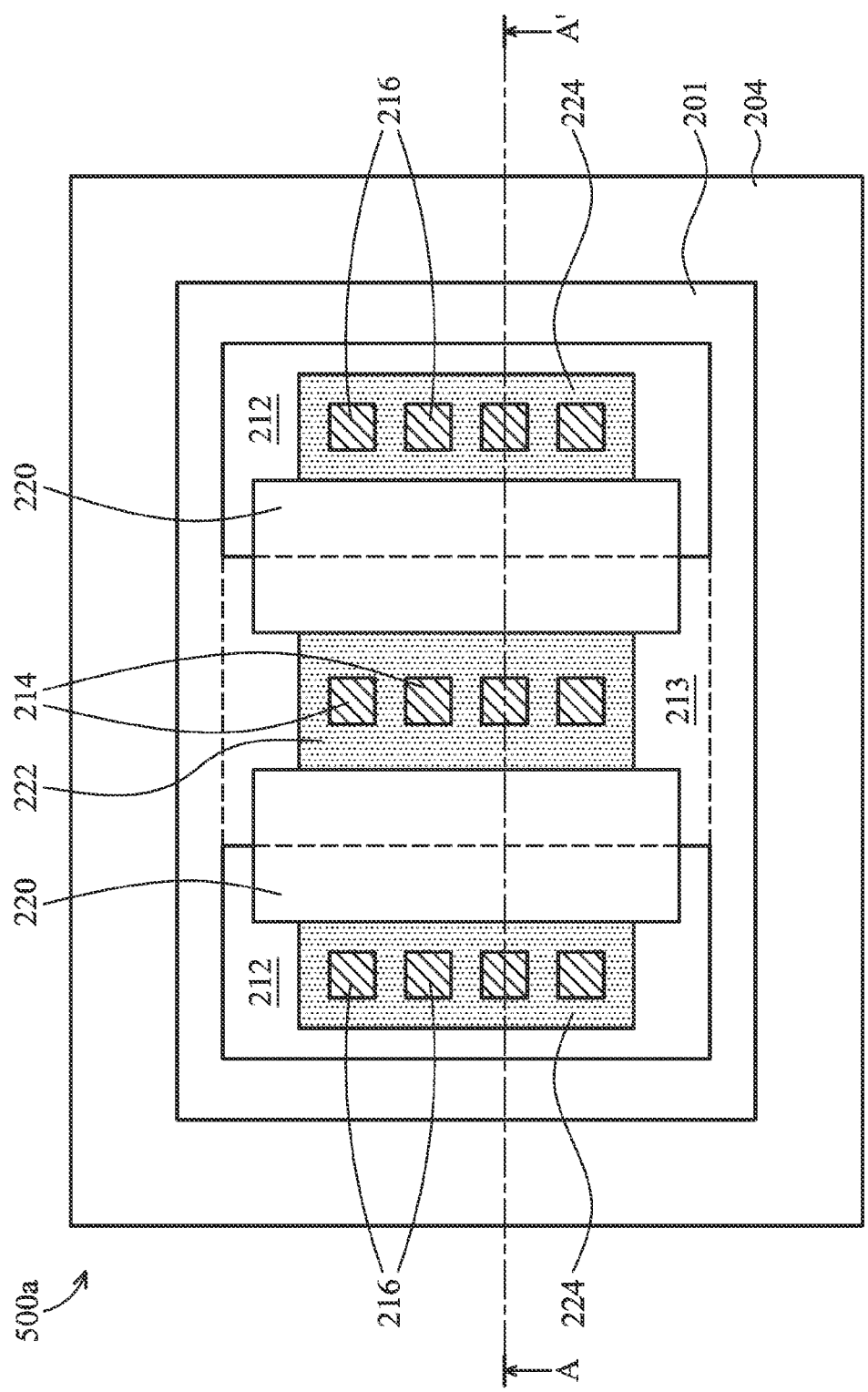
FIG. 2A is a top view showing a layout of one exemplary embodiment of an ESD protection device of the invention.
Figure 2B:
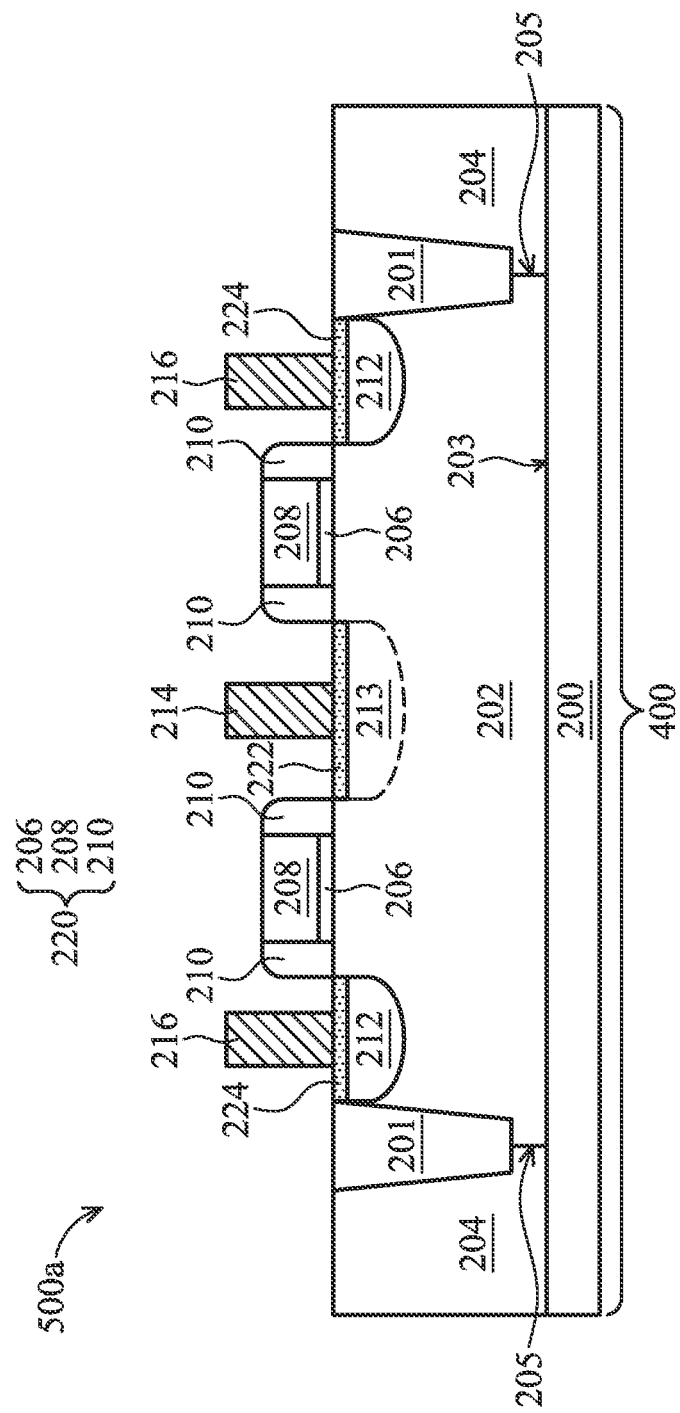
FIG. 2B is a cross section of one exemplary embodiment of an electrostatic discharge (ESD) protection device along line A-A' of FIG. 2A.

FIG. 2A is a top view showing a layout of one exemplary embodiment of an ESD protection device 500a of the invention. FIG. 2B is a cross section of one exemplary embodiment of an electrostatic discharge (ESD) protection device along line A-A' of FIG. 2A. As shown in FIGS. 2A and 2B, one exemplary embodiment of an ESD protection device 500a comprises a semiconductor substrate 200 having an active region 400. The semiconductor substrate 200 may comprise silicon. In alternative embodiments, SiGe, bulk semiconductor, strained semiconductor, compound semiconductor, silicon on insulator (SOI), and other commonly used semiconductor substrates can be used for the semiconductor substrate 200. The semiconductor substrate 200 may have a desired conductive type by implanting p-type or n-type impurities. A first well region 202 having a first conductive type is formed in the active region 400. A second well region 204 is formed in the active region 400 surrounding a boundary 205 of the first well region 202. A plurality of first doped regions 212 having the first conductive type is formed in the first well region 202, adjacent to a surface of the semiconductor substrate 200. In one embodiment, the first doped regions 212 are respectively separated from the boundary 205 of the first well region 202 by a plurality of shallow trench isolation (STI) features 201. In one embodiment, a dopant concentration of the first doped region 212 is larger than that of the first well region. Therefore, if the first well region 202 serves as an n-type well region 202, the first doped region 212 would serve as an n-type heavily (n+) doped region 212. Alternatively, if the first well region 202 serves as a p-type well region 202, the first doped region 212 would serve as a p-type heavily (p+) doped region 212. The ESD protection device 500a further comprises at least two metal contacts for anode and cathode electrodes of a Schottky diode. As shown in FIGS. 2A and 2B, a first metal contact 216 is disposed on the first doped region 212. A second metal contact 214 is disposed on the active region 400 (adjacent to the surface of the semiconductor substrate 200), connecting to the first well region 202 without through any heavily (n+ or p+) doped region. In this embodiment, the first metal contact 216 and the second metal contact 214 are separated by a poly pattern 208 disposed on the first well region 202. Also, according to a design rule of standard semiconductor technology, the first metal contact 216 and the second metal contact 214 must be kept away from the poly pattern 208 by at least a designed distance (not shown). Further, according to standard semiconductor technology, an insulating pattern 206 is formed between the poly pattern 208 and the semiconductor substrate 200 before forming the poly pattern 208. Moreover, after forming the poly pattern 208, spacers 210 are disposed on two opposite sidewalls of the poly pattern 208, respectively. Therefore, the insulating pattern 206, the poly pattern 208 and the spacers 210 may collectively compose a gate structure 220. Also, according to standard semiconductor technology, a first silicide pattern 224 and a second silicide pattern 222 may respectively cover different portions of the first well region 202 not covered by the gate structure 220 to improve conductivity between the first metal contact 216/the second metal contact 214 and the semiconductor substrate 200. As shown in FIGS. 2A and 2B, the first silicide pattern 224 is disposed between the first metal contact 216 and the first doped region 212, and the second silicide pattern 222 is disposed between the second metal contact 214 and the first well region 202. In this embodiment, the ESD protection device 500a is a Schottky diode composed by the second metal contact 214 and the first well region 202. As shown in FIG. 2B, a shallow trench isolation 201 is positioned at an outer perimeter of the first well region 202, where no insulating isolation is formed between the first metal contact 216 and the second metal contact 214.

In one embodiment, the semiconductor substrate 200, the first well region 202 and the first doped region 212 may have a conductive type the same as the second well region 204. For example, the semiconductor substrate 200 serves as a p-type semiconductor substrate 200, the first well region 202 serves as a p-type well (PW) region 202, and the second well region 204 also serves as a p-type well (PW) region 204. Also, the first doped region 212 serves as a p-type heavily (p+) doped region. In this embodiment, the first metal contact 216 is coupled to a high voltage power supply terminal VDD and the second metal contact 214 is coupled to an input/output device (IO).

In another embodiment, the semiconductor substrate 200 may have a conductive type different from the first well region 202 and the first doped region 212. Also, the second well region 204 may have a conductive type different from the first well region 202 and the first doped region 212. For example, the semiconductor substrate 200 serves as a p-type semiconductor substrate 200, the first well region 202 serves as an n-type well (NW) region 202, and the second well region 204 serves as a p-type well (PW) region 204. The second well region 204 serves as a guard ring of the ESD protection device 500a. Also, the first doped region 212 serves as an n-type heavily (n+) doped region. In this embodiment, the first metal contact 216 is coupled to an input/output device (IO) and the second metal contact 214 is coupled to a low voltage power supply terminal VSS. It is noted that the poly pattern 208 is electrically floating or optionally connected to another pin.

Additionally, in one embodiment, a second doped region 213 having the first conductive type is optionally formed in the first well region 202. Also, the second metal contact 214 is disposed on the second doped region 213. In this embodiment, the second doped region 213 may serve as a lightly doped region, and a dopant concentration of the second doped region 213 is less than that of the first doped region 212. For example, if the first doped region 212 serves as a p-type heavily (p+) doped region, the second doped region 213 may serve as a p-type lightly doped drain (PLDD) region. If the first doped region 212 serves as an n-type heavily (n+) doped region, the second doped region 213 may serve as an n-type lightly doped drain (NLDD) region.

Figure 3A:
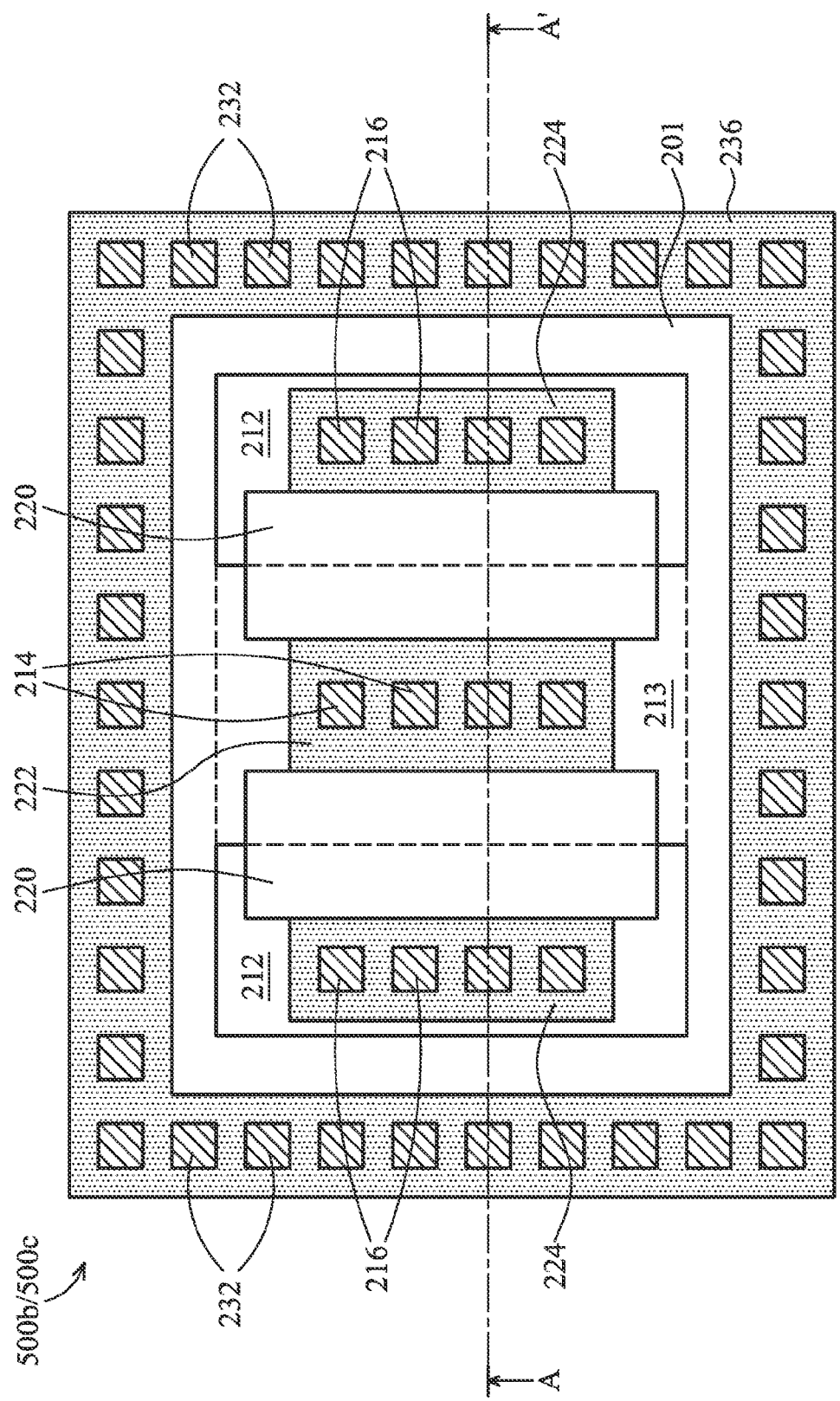
FIG. 3A is a top view showing a layout of various exemplary embodiments of an ESD protection device of the invention.
Figure 3B:
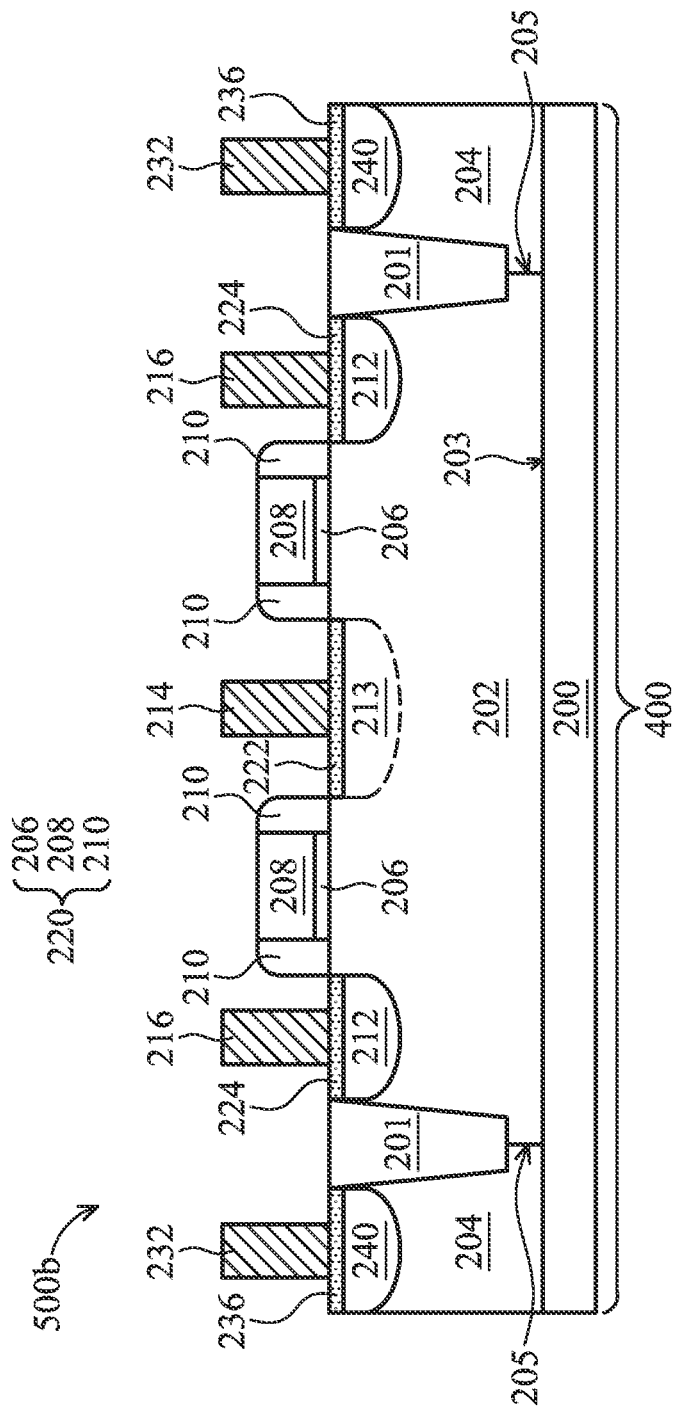
FIGS. 3B and 3C are cross sections of various exemplary embodiments of an electrostatic discharge (ESD) protection device along line A-A' of FIG. 3A.
Figure 3C:
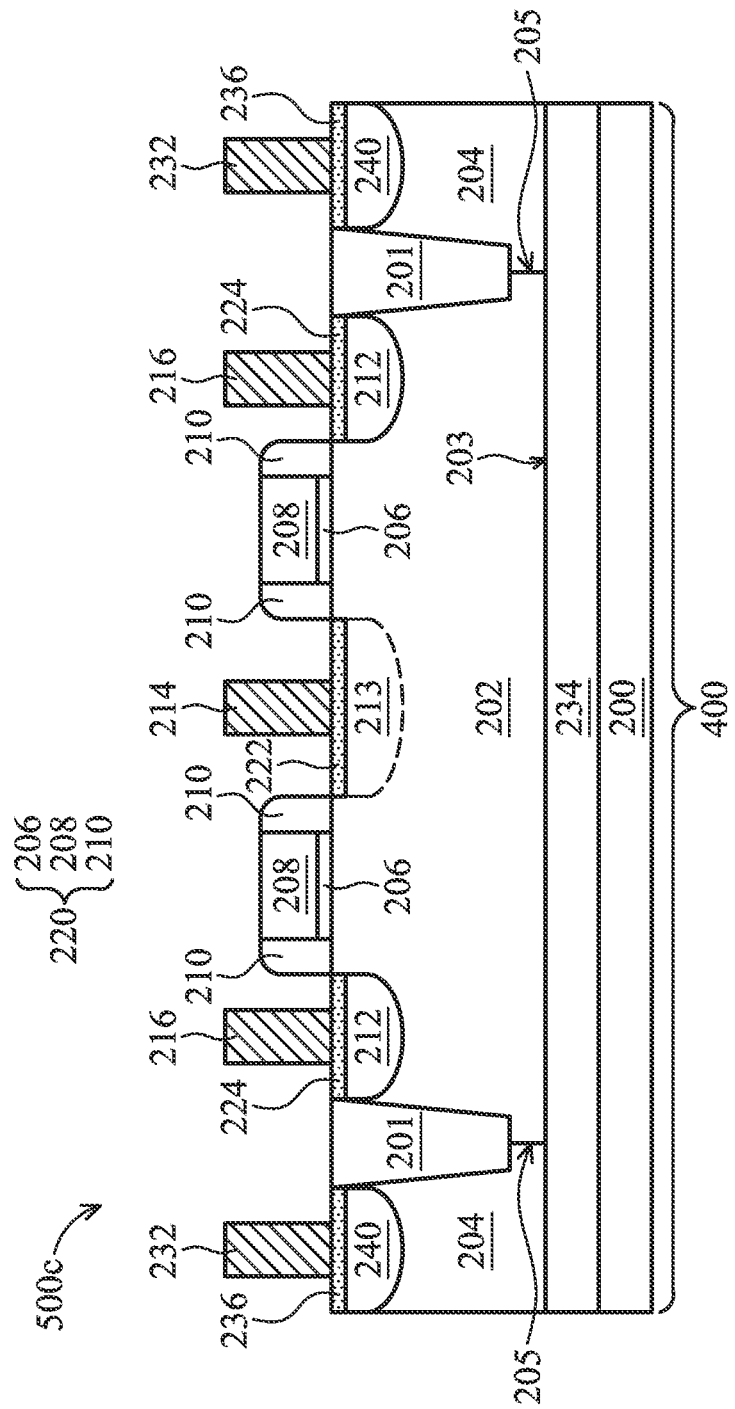

FIG. 3A is a top view showing a layout of various exemplary embodiments of an ESD protection device 500b and 500c of the invention. FIGS. 3B and 3C are cross sections of various exemplary embodiments of an electrostatic discharge (ESD) protection device along line A-A' of FIG. 3A, showing cross sections of various exemplary embodiments of an ESD protection device 500b and 500c. Elements of this embodiment which are the same as those previously described in FIGS. 2A and 2B, are not repeated for brevity. As shown in FIGS. 3A and 3B, differences between the ESD protection device 500a and 500b is that the ESD protection device 500b further comprises a third doped region 240 having the second conductive type opposite to the first conductive type formed in the second well region. The third doped region 240 and the second doped region 213 are separated by the STI feature 201. Further, a dopant concentration of the third doped region 240 is larger than that of the second well region 204. A third metal contact 232 is disposed on the third doped region 240. As shown in FIGS. 3A and 3B, the third silicide pattern 236 is disposed between the third metal contact 232 and the third doped region 240.

In this embodiment as shown in FIGS. 3A and 3B, the semiconductor substrate 200 may have a conductive type different to the first well region 202 and the first doped region 212. Also, the third doped region 240 may have a conductive type the same as the second well region 204. For example, the semiconductor substrate 200 serves as a p-type semiconductor substrate 200, the first well region 202 serves as an n-type well (NW) region 202, and the second well region 204 serves as a p-type well (PW) region 204. The second well region 204 serves as a guard ring 204 of the ESD protection device 500b, and the third doped region 240 serves as a pick-up doped region of the guard ring 204 of the ESD protection device 500b. Also, the first doped region 212 serves as an n-type heavily (n+) doped region 212, and the third doped region 240 serves as a p-type heavily (p+) doped region 240. In this embodiment, the first metal contact 216 is coupled to an input/output device (IO) and the second metal contact 214 is coupled to a low voltage power supply terminal VSS. It is noted that the poly pattern 208 is electrically floating or optionally connected to another pin. Additionally, in one embodiment, a second doped region 213 having the first conductive type is optionally formed in the first well region 202. For example, the second doped region 213 may serve as an n-type lightly doped drain (NLDD) region.

As shown in FIGS. 3A and 3C, differences between the ESD protection device 500b and 500c is that the ESD protection device 500c further comprise a third well region 234 formed in the active region 400, contacting a bottom 204 of the first well region 202 and a bottom 205 of the second well region 204 while the semiconductor substrate 200 has the first conductive type, which is the same as the first well region 202 and the first doped region 212. In this embodiment as shown in FIGS. 3A and 3C, the first well region 202 may have a conductive type different to the second well region 204. Also, the third well region 234 and the third doped region 240 may have a conductive type the same as the second well region 204. For example, the semiconductor substrate 200 serves as a p-type semiconductor substrate 200, the first well region 202 serves as a p-type well (PW) region 202, the second well region 204 serves as an n-type well (NW) region 204, and the third well region 234 serves as a deep n-type well (DNW) region 234. The second well region 204 serves as a guard ring 204 of the ESD protection device 500c, and the third doped region 240 serves as a pick-up doped region of the guard ring 204 of the ESD protection device 500b. Also, the first doped region 212 serves as a p-type heavily (p+) doped region 212, and the third doped region 240 serves as an n-type heavily (n+) doped region 240. In this embodiment, the first metal contact 216 is coupled to a high voltage power supply terminal VDD and the second metal contact 214 is coupled to an input/output device (IO). It is noted that the poly pattern 208 is electrically floating or optionally connected to another pin. Additionally, in one embodiment, a second doped region 213 having the first conductive type is optionally formed in the first well region 202. For example, the second doped region 213 may serve as a p-type lightly doped drain (PLDD) region.

Figure 4A:
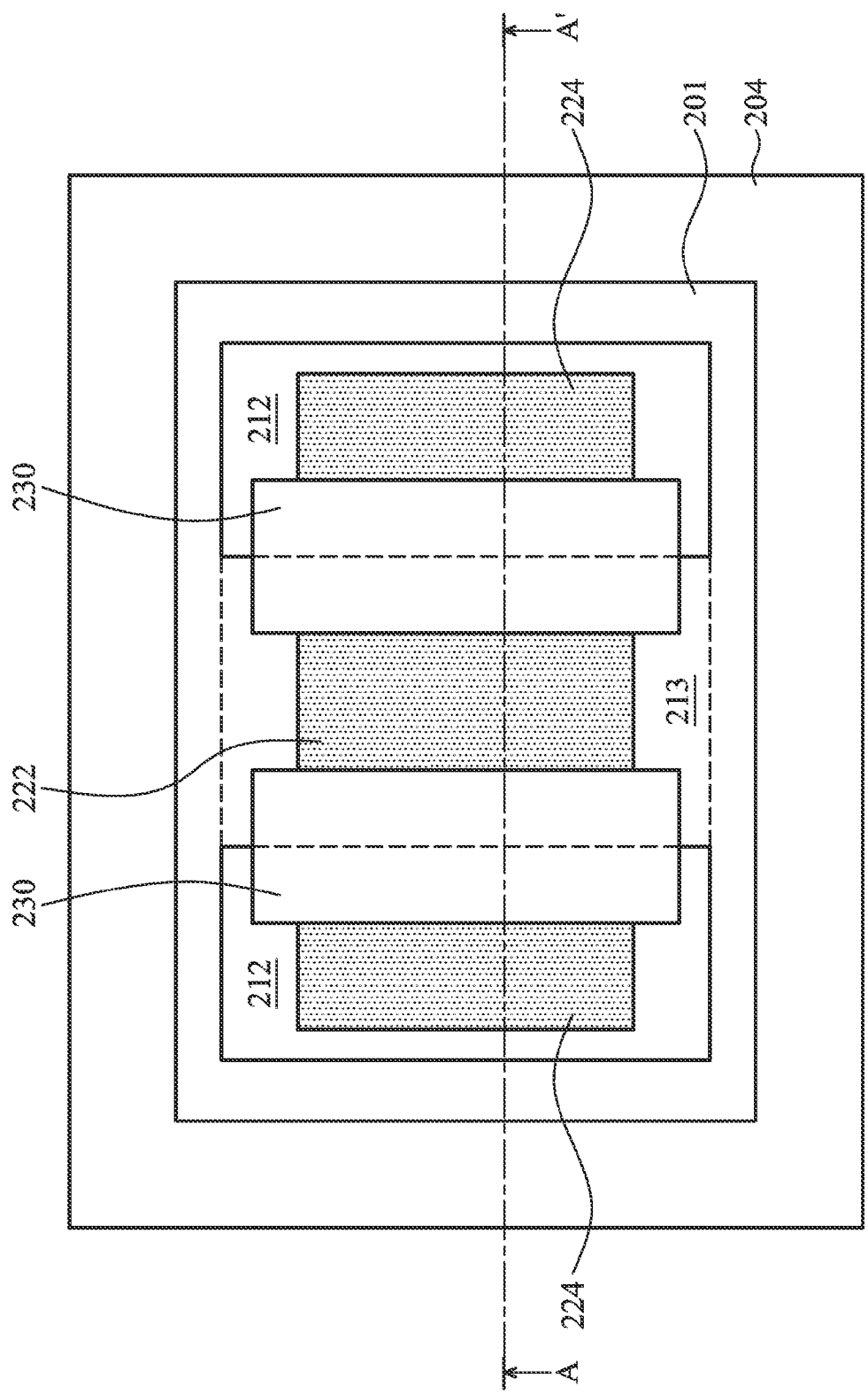
FIGS. 4A and 5A are top views showing intermediate processes for fabricating another exemplary embodiment of an ESD protection device of the invention.
Figure 4B:
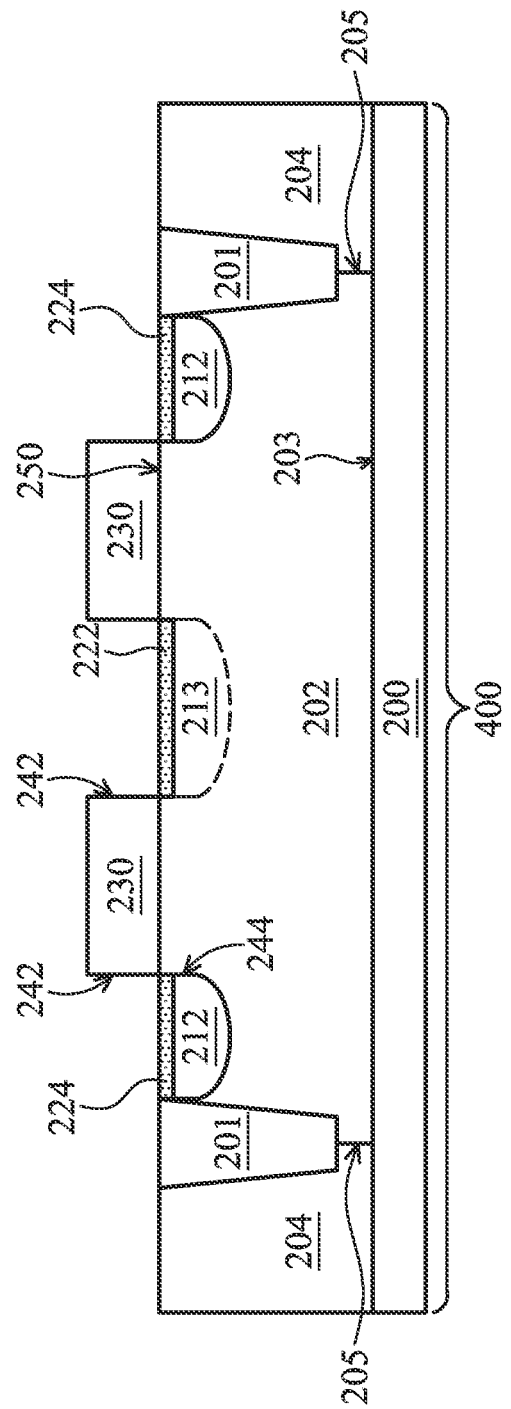
FIGS. 4B and 5B are cross sections of another exemplary embodiment of an electrostatic discharge (ESD) protection device along line A-A' of FIGS. 4A and 5A.
Figure 5A:
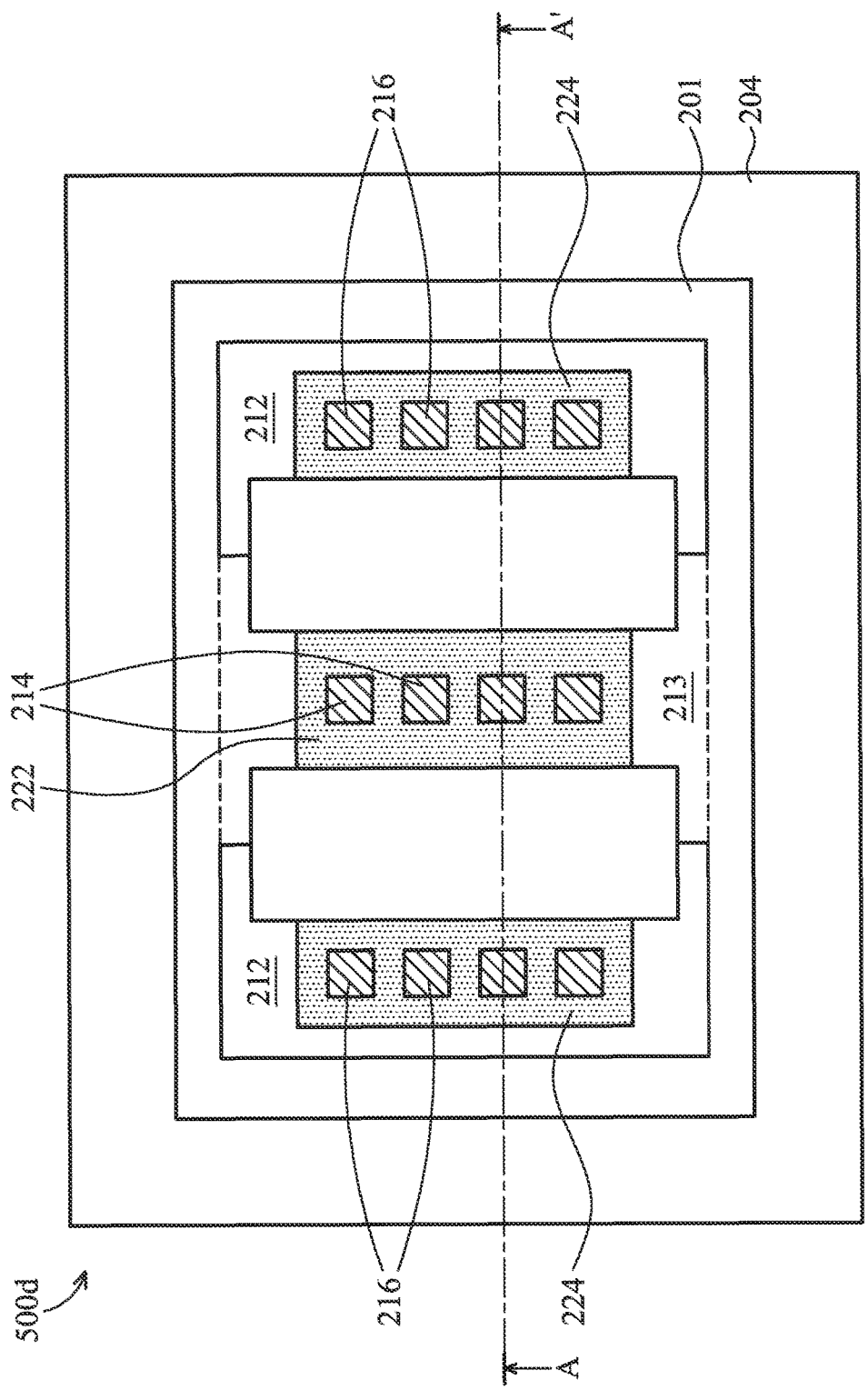
Figure 5B:
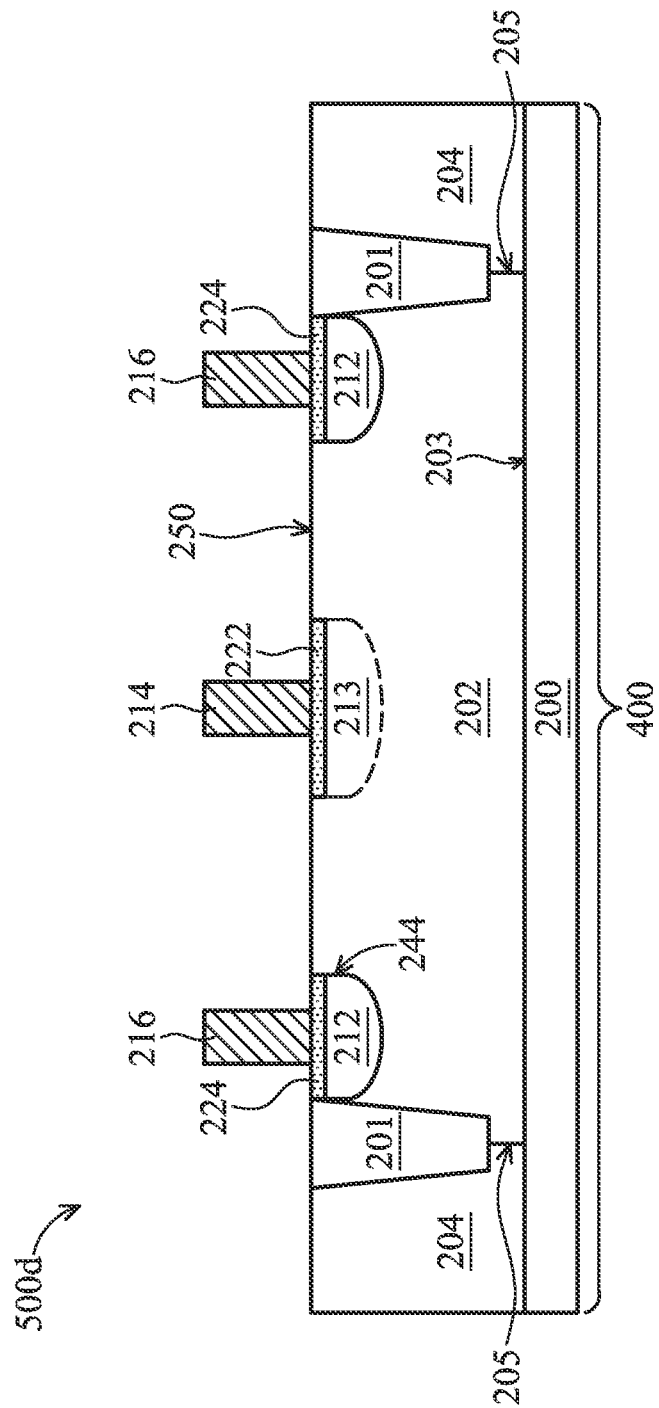

FIGS. 4A and 5A are top views showing intermediate processes for fabricating another exemplary embodiment of an ESD protection device 500d of the invention. FIGS. 4B and 5B are cross sections of one exemplary embodiment of an electrostatic discharge (ESD) protection device along line A-A' of FIGS. 4A and 5A. Elements of this embodiment which are the same as those previously described in FIGS. 2A and 2B, are not repeated for brevity. As shown in FIGS. 4A, 4B, 5A and 5B, differences between the ESD protection devices 500a and 500d are that the ESD protection device 500d is fabricated further using a resistor protection oxide (RPO) process to form at least one insulating layer pattern 230 on the first well region 202, covering at least a portion of an upper surface 250 of the first well region 202. The insulating layer pattern 230 may serve as a mask to prevent a formation of a silicide pattern on the portion of the upper surface 250 of the first well region 202 covered by the insulating layer pattern 230. In this embodiment, the insulating layer pattern 230 is a resistor protection oxide (RPO) pattern 230. Next, an implantation processes is performed to form first doped regions 212 having the first conductive type is formed in the first well region 202, adjacent to a surface of the semiconductor substrate 200. As shown in FIGS. 4A and 4B, one of the vertical sidewalls 242 of the insulating layer pattern 230 is aligned to a boundary 244 of the first doped region 212. Additionally, in one embodiment, a second doped region 213 having the first conductive type is optionally formed in the first well region 202. Next, a silicide process is performed to form first silicide patterns 224 on other portions of the upper surface 250 of the first well region 202 without covered by the insulating layer pattern 230. As shown in FIGS. 4A and 4B, the first silicide patterns 224 may respectively cover the first doped regions 212. Optionally, one of the first silicide patterns 224 may cover the second doped region 213.

As shown in FIGS. 5A and 5B, next, the insulating layer pattern 230 as shown in FIGS. 4A and 4B is removed. Next, a first metal contact 216 is formed on the first doped region 212. Also, a second metal contact 214 is formed on the active region 400 (adjacent to the surface of the semiconductor substrate 200), connecting to the first well region 202 without through any heavily (n+ or p+) doped region. In one embodiment with the second doped region 213 optionally formed in the first well region 202, the second metal contact 214 may be disposed on the second doped region 213. After the aforementioned processes, another exemplary embodiment of an ESD protection device 500d is completely formed.

Figure 6A:
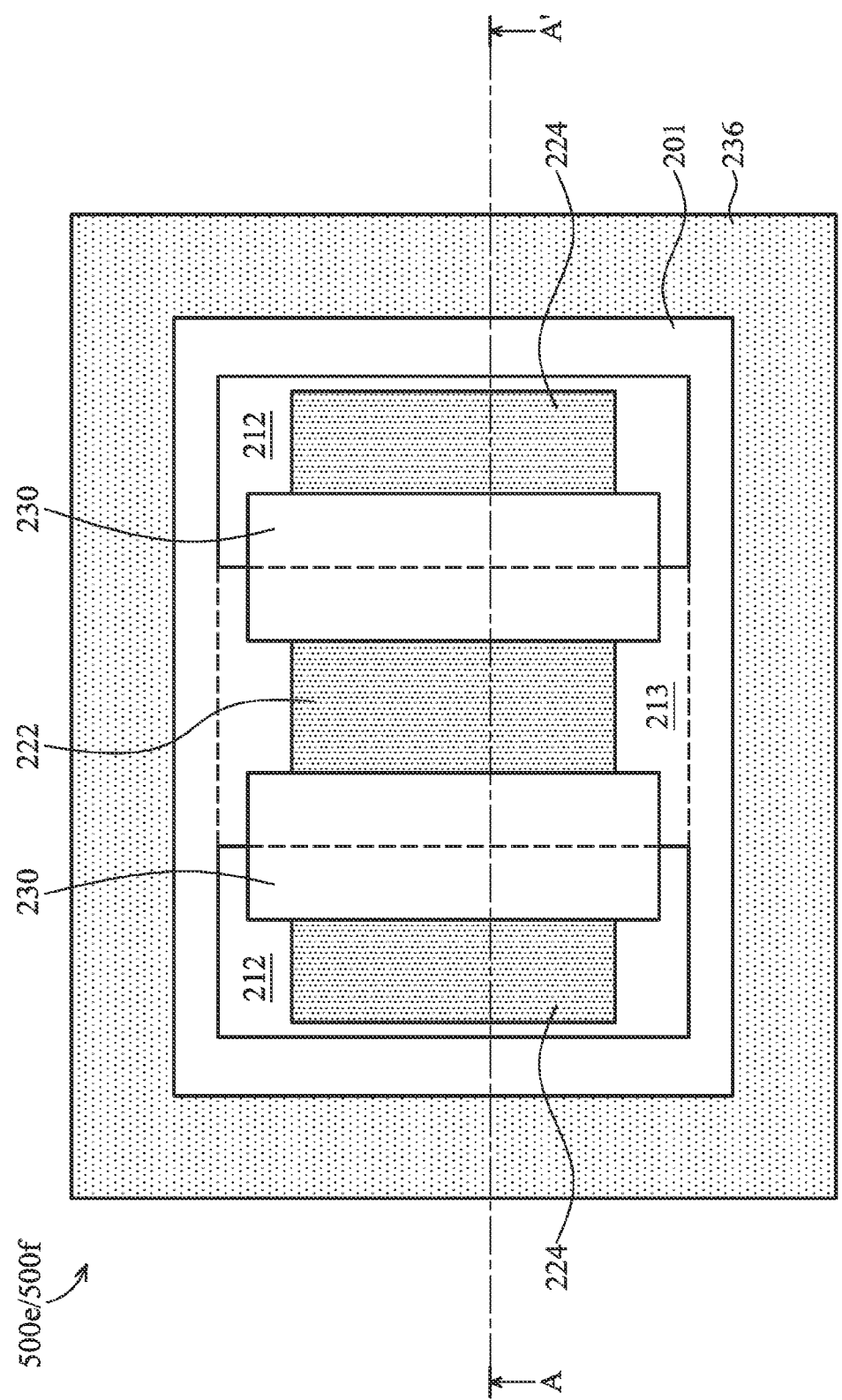
FIGS. 6A and 7A are top views showing intermediate processes for fabricating yet another exemplary embodiment of an ESD protection device of the invention.
Figure 6B:
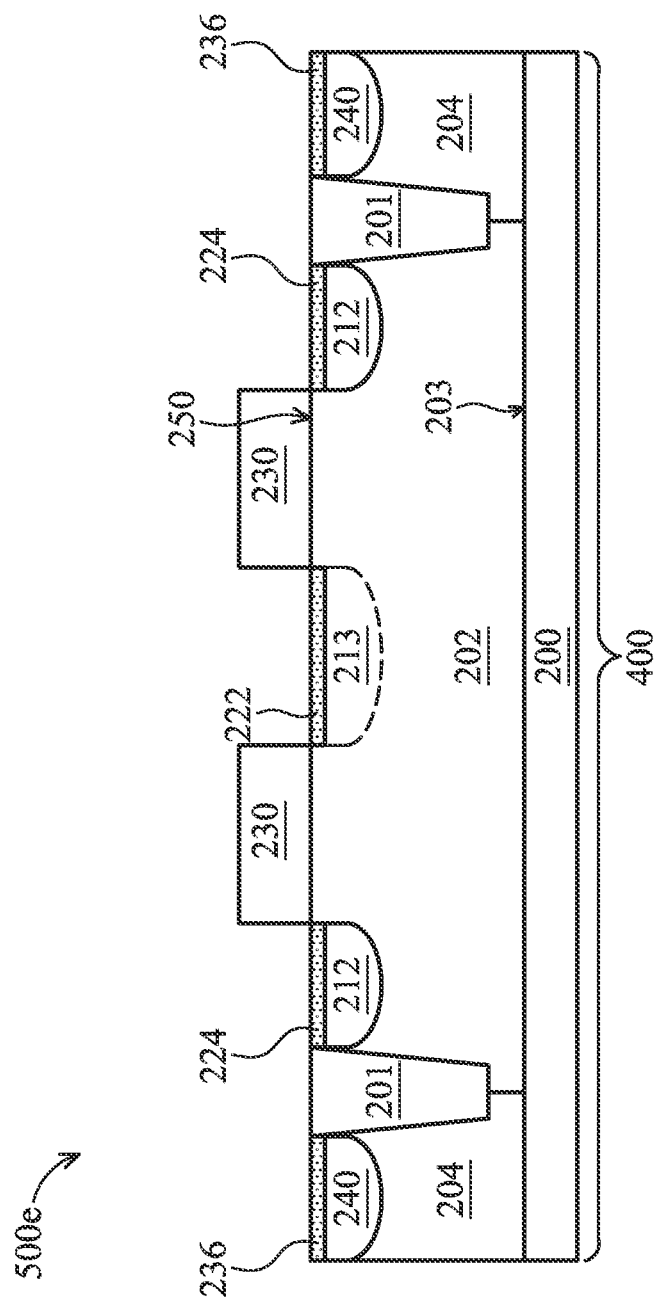
FIGS. 6B, 7B and 7C are cross sections of other exemplary embodiments of an electrostatic discharge (ESD) protection device along line A-A' of FIGS. 6A and 7A.
Figure 7A:
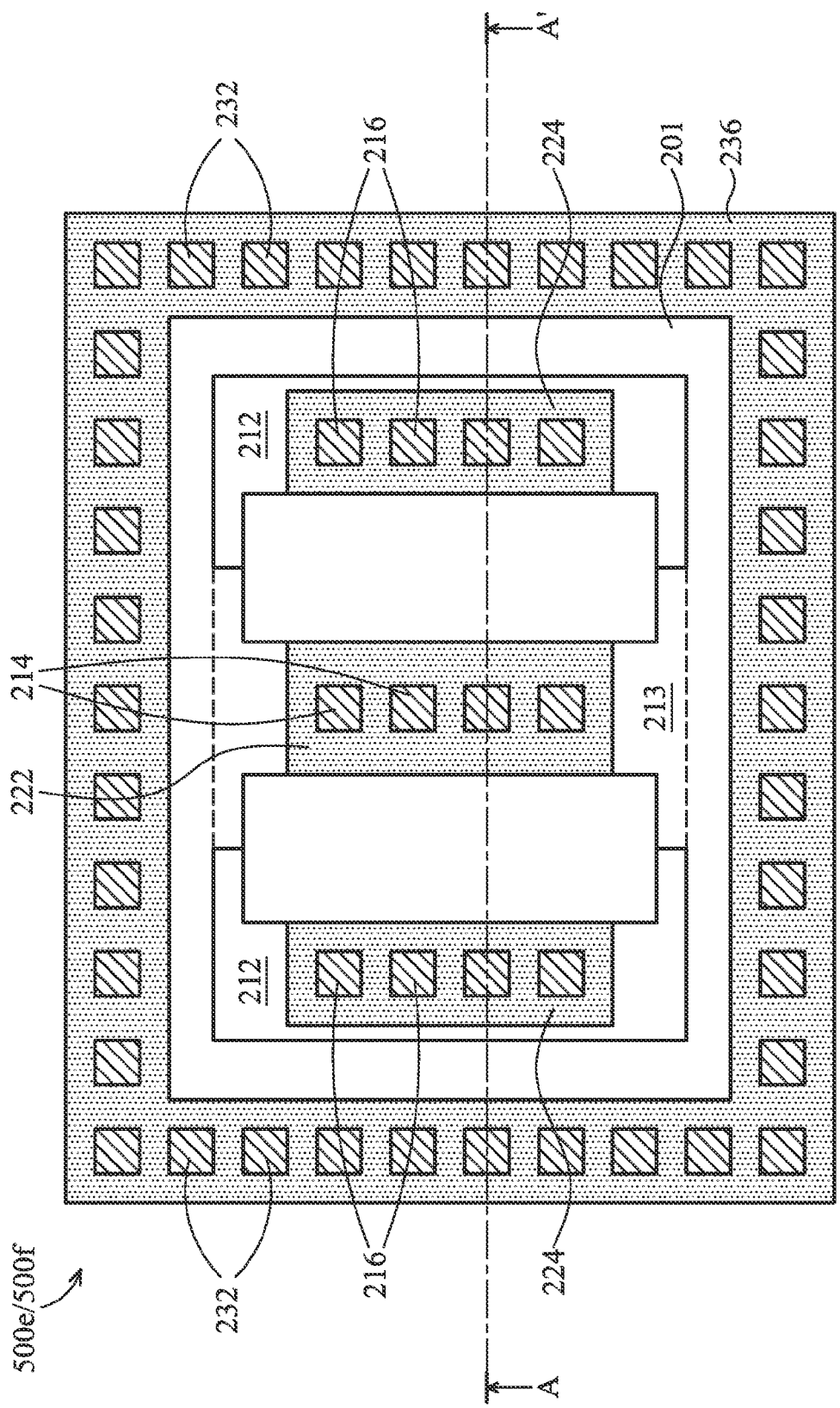
Figure 7B:
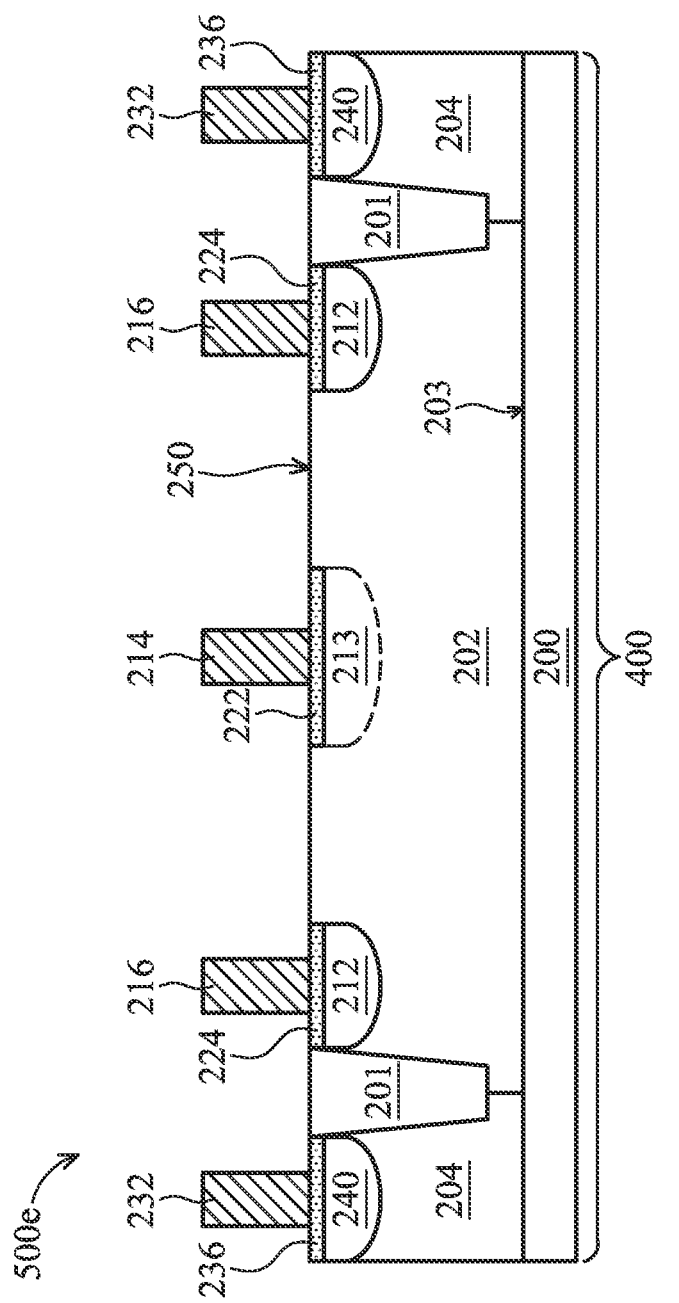
Figure 7C:
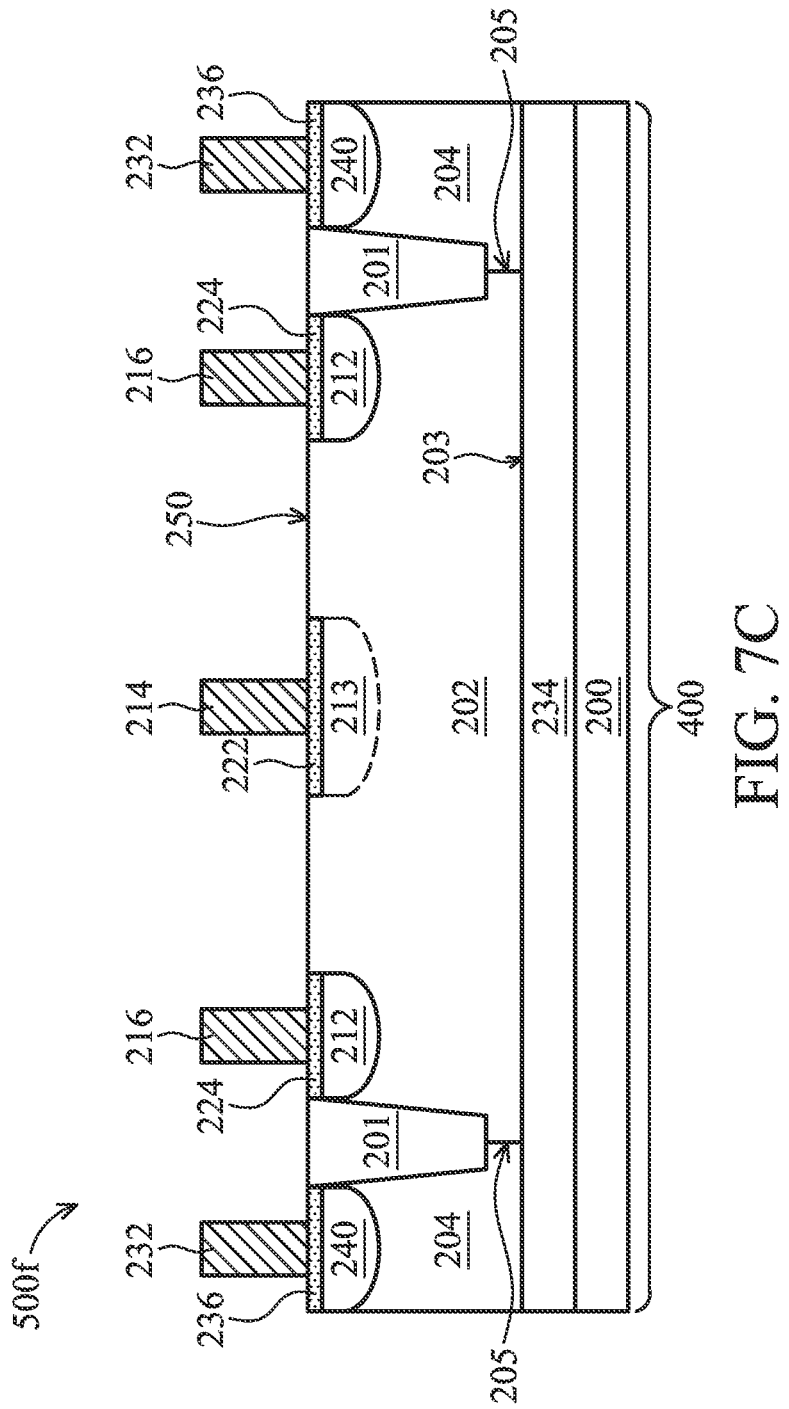

FIGS. 6A and 7A are top views showing intermediate processes for fabricating yet another exemplary embodiment of ESD protection devices 500e and 500f of the invention. FIGS. 6B, 7B and 7C are cross sections of other exemplary embodiments of an electrostatic discharge (ESD) protection device along line A-A' of FIGS. 6A and 7A, showing cross sections of various exemplary embodiments of the ESD protection devices 500e and 500f. Elements of this embodiment which are the same as those previously described in FIGS. 3A to 3C, are not repeated for brevity. As shown in FIGS. 6A, 6B, 7A, 7B and 7C, differences between the ESD protection devices 500b-500c and 500e-500f are that the ESD protection device 500d is fabricated further using a resistor protection oxide (RPO) process to form at least one insulating layer pattern 230 on the first well region 202, covering at least a portion of an upper surface 250 of the first well region 202. The insulating layer pattern 230 may serve as a mask to prevent a formation of a silicide pattern on the portion of the upper surface 250 of the first well region 202 covered by the insulating layer pattern 230. In this embodiment, the insulating layer pattern 230 is a resistor protection oxide (RPO) pattern 230. Next, an implantation processes is performed to form first doped regions 212 having the first conductive type is formed in the first well region 202, adjacent to a surface of the semiconductor substrate 200. Also, another implantation processes is performed to form a third doped region 240 having the second conductive type opposite to the first conductive type formed in the second well region 204. Next, a silicide process is performed to form first silicide patterns 224 on other portions of the upper surface 250 of the first well region 202 without covered by the insulating layer pattern 230. As shown in FIGS. 6A and 6B, the first silicide patterns 224 may respectively cover the first doped regions 212. Optionally, one of the first silicide patterns 224 may cover the second doped region 213.

As shown in FIGS. 7A, 7B and 7C, next, the insulating layer pattern 230 as shown in FIGS. 6A and 6B is removed. Next, a first metal contact 216 is formed on the first doped region 212. Also, a second metal contact 214 is formed on the active region 400 (adjacent to the surface of the semiconductor substrate 200), connecting to the first well region 202 without through any heavily (n+ or p+) doped region. In one embodiment with the second doped region 213 optionally formed in the first well region 202, the second metal contact 214 may be disposed on the second doped region 213. After the aforementioned processes, yet another exemplary embodiment of an ESD protection device 500e/500f is completely formed. As shown in FIGS. 7B and 7C, differences between the ESD protection device 500e and 500f is that the ESD protection device 500f further comprises a third doped region 240 having the second conductive type opposite to the first conductive type formed in the second well region. The third doped region 240 and the second doped region 213 are separated by the STI feature 201. Further, a dopant concentration of the third doped region 240 is larger than that of the second well region 204. Moreover, a third metal contact 232 is formed on the third doped region 240. It is noted that a minimum distance between the first metal contact 216 and the second metal contact 214 of the ESD protection device 500d-500f is less than a minimum distance between the first metal contact 216 and the second metal contact 214 separated by the poly pattern 208 of the ESD protection device 500a-500c, because the design rule for the RPO pattern is narrower than the poly pattern.

Embodiments provide an electrostatic discharge (ESD) protection device. The ESD protection device is composed by a Schottky diode to protect an input/output (IO) device Advantages of the ESD protection device are that the ESD protection device has a lower threshold voltage (about 0.4V) at a forward turn on than the conventional gated or STI diode (about 0.7V). Also, the ESD protection device has a lower junction capacitance than the conventional gated or STI diode, resulting in a lower loading ESD protection device. Therefore, the ESD protection device is suitable to be used in a high speed circuit. Further, the ESD protection device uses a poly pattern or a RPO pattern (to replace the STI) to separate the anode and the cathode of the ESD protection device. A minimum distance between the anode and the cathode of the ESD protection device can be further reduced. Compared with the conventional STI diode, the ESD protection device has a lower turn on resistance.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection device, comprising:
   a semiconductor substrate having an active region;
   a first well region having a first conductive type formed in the active region;
   a first doped region having the first conductive type formed in the first well region;
   a first metal contact disposed on the first doped region;
   a second metal contact disposed on the active region, connecting to the first well region;
   a first silicide pattern and a second silicide pattern respectively covering different portions of the first well region not covered by a gate structure; and
   a shallow trench isolation positioned at an outer perimeter of the first well region, wherein no insulating isolation is formed between the first metal contact and the second metal contact.

2. The ESD protection device as claimed in claim 1, wherein the first metal contact and a second metal contact are separated by a poly pattern disposed on the first well region.

3. The ESD protection device as claimed in claim 1, wherein the first silicide pattern and the second silicide pattern are respectively adjacent to two opposite sides of the poly pattern.

4. The ESD protection device as claimed in claim 1, wherein a dopant concentration of the first doped region is larger than that of the first well region.

5. The ESD protection device as claimed in claim 1, further comprising:
   a second well region having a second conductive type opposite to the first conductive type formed in the active region surrounding a boundary of the first well region;
   a third doped region having the second conductive type formed in the second well region, wherein a dopant concentration of the third doped region is larger than that of the second well region; and
   a third metal contact disposed on the third doped region.

6. The ESD protection device as claimed in claim 5, further comprising a third well region formed in the active region, contacting bottoms of the first and second well regions when the semiconductor substrate has the first conductive type.

7. The ESD protection device as claimed in claim 5, wherein the semiconductor substrate has the second conductive type.

8. The ESD protection device as claimed in claim 5, wherein a dopant concentration of the third doped region is larger than that of the second well region.

9. The ESD protection device as claimed in claim 1, further comprising:
   a second well region having the first conductive type formed in the active region surrounding a boundary of the first well region.

10. The ESD protection device as claimed in claim 1, wherein the first conductive type is n-type and the semiconductor substrate is p-type, and the first metal contact is coupled to an input/output device and the second metal contact is coupled to a high voltage power supply terminal or the first metal contact is coupled to a low voltage power supply terminal and the second metal contact is coupled to an input/output device.

11. The ESD protection device as claimed in claim 1, wherein the first conductive type is p-type and the semiconductor substrate is p-type, and the first metal contact is coupled to a high voltage power supply terminal and the second metal contact is coupled to an input/output device or the first metal contact is coupled to an input/output device and the second metal contact is coupled to a low voltage power supply terminal.

12. The ESD protection device as claimed in claim 2, further comprising spacers disposed on two opposite sidewalls of the poly pattern, respectively.

13. The ESD protection device as claimed in claim 1, wherein the poly pattern or the insulating layer pattern is electrically floating.

14. The ESD protection device as claimed in claim 1, wherein the second metal contact and the first well region are formed as a Schottky diode.

15. The ESD protection device as claimed in claim 1, wherein at least a portion of an upper surface of the first well region does not have silicide.

16. The ESD protection device as claimed in claim 15, wherein the portion of an upper surface of the first well region is covered by a poly pattern.

17. The ESD protection device as claimed in claim 15, further comprising:
- a second well region having a second conductive type opposite to the first conductive type formed in the active region surrounding a boundary of the first well region;
- a third doped region having the second conductive type formed in the second well region, wherein a dopant concentration of the third doped region is larger than that of the second well region; and
- a third metal contact disposed on the third doped region.

18. The ESD protection device as claimed in claim 15, further comprising a third well region formed in the active region, contacting bottoms of the first and second well regions when the semiconductor substrate has the first conductive type.

19. The ESD protection device as claimed in claim 1, wherein:
- the first doped region is one of a pair of first doped regions formed in the first well region, and the first metal contact is one of a pair of first metal contacts;
- each of the pair of first metal contacts is disposed on a corresponding one of the pair of first doped regions; and
- the pair of first metal contacts are spaced from each other with the second metal contact being positioned therebetween.

* * * * *